(12) United States Patent
Shin et al.

(10) Patent No.: US 12,708,038 B2
(45) Date of Patent: Aug. 11, 2026

(54) SEMICONDUCTOR DEVICE AND METHOD OF DIE ATTACH WITH ADHESIVE LAYER CONTAINING GRAPHENE-COATED CORE

(71) Applicant: STATS ChipPAC Pte. Ltd., Singapore (SG)

(72) Inventors: YongMoo Shin, Incheon (KR); HeeSoo Lee, Incheon (KR); SuJeong Kwon, Incheon (KR)

(73) Assignee: STATS ChipPAC Pte. Ltd., Singapore (SG)

(*) Notice: Subject to any disclaimer, the term of this patent is extended or adjusted under 35 U.S.C. 154(b) by 443 days.

(21) Appl. No.: 18/064,149

(22) Filed: Dec. 9, 2022

(65) Prior Publication Data

US 2024/0194628 A1 Jun. 13, 2024

(51) Int. Cl.
*H10W 90/00* (2026.01)
*H10W 70/65* (2026.01)
(Continued)

(52) U.S. Cl.
CPC ......... *H10W 90/00* (2026.01); *H10W 70/657* (2026.01); *H10W 70/658* (2026.01);
(Continued)

(58) Field of Classification Search
CPC ............. H01L 23/295; H01L 23/49816; H01L 23/49513; H01L 24/29; H01L 2224/29347;
(Continued)

(56) References Cited

U.S. PATENT DOCUMENTS 6,114,413 A * 9/2000 Kang ........................ C08K 9/02 523/210
7,659,145 B2 2/2010 Do et al.
(Continued)

FOREIGN PATENT DOCUMENTS

CN 102867793 A 1/2013
CN 102892857 A 1/2013
(Continued)

OTHER PUBLICATIONS

Yu Seong Lee, Laser-Sintered Silver Nanoparticles as a Die Adhesive Layer for High-Power Light-Emitting Diodes, IEEE Transactions on Components, Packaging and Manufacturing Technology. vol. 4, No. 7, Jul. 2014, pp. 1119-1124.
(Continued)

*Primary Examiner* — Khiem D Nguyen
(74) *Attorney, Agent, or Firm* — Robert D. Atkins; PATENT LAW GROUP: Atkins and Associates, P.C.

(57) ABSTRACT

A semiconductor device has a substrate and an adhesive layer with a graphene core shell deposited over a surface of the substrate. An electrical component is affixed to the substrate with the adhesive layer. A bond wire is connected between the electrical component and substrate. The graphene core shell has a copper core and graphene coating over the copper core. The graphene coated core shell is embedded within a matrix. The graphene core shells within the adhesive layer to form a thermal path. The matrix can be a thermoset material or polymer or composite epoxy type matrix. The graphene core shell is embedded within the thermoset material or polymer or composite epoxy type matrix. The adhesive layer with graphene core shell is useful for die attachment. The graphene core adhesive layer provides exceptional heat dissipation, shock absorption, and vibration dampening.

25 Claims, 10 Drawing Sheets

(51) Int. Cl.
*H10W 72/30* (2026.01)
*H10W 72/00* (2026.01)
*H10W 72/50* (2026.01)

(52) U.S. Cl.
CPC *H10W 72/01338* (2026.01); *H10W 72/07553* (2026.01); *H10W 72/07554* (2026.01); *H10W 72/325* (2026.01); *H10W 72/351* (2026.01); *H10W 72/352* (2026.01); *H10W 72/353* (2026.01); *H10W 72/354* (2026.01); *H10W 72/537* (2026.01); *H10W 72/547* (2026.01); *H10W 72/865* (2026.01); *H10W 72/884* (2026.01); *H10W 90/701* (2026.01); *H10W 90/732* (2026.01); *H10W 90/736* (2026.01); *H10W 90/753* (2026.01); *H10W 90/756* (2026.01)

(58) Field of Classification Search
CPC . H01L 2224/29499; H01L 2224/29247; H01L 25/0652; H01L 24/27; H01L 24/32; H01L 24/63; H01L 23/49805; H01L 25/162; H10W 90/00; H10W 72/013; H10W 72/073; H10W 72/30; H10W 72/325; H10W 72/351; H10W 72/865; H10W 72/884
See application file for complete search history.

(56) References Cited

U.S. PATENT DOCUMENTS 7,700,943 B2 4/2010 Raravikar et al.
7,886,813 B2 2/2011 Hua et al.
7,989,707 B2 8/2011 Yamano et al.
8,106,495 B2 1/2012 Kajiki
8,107,242 B2 1/2012 Yoshimoto et al.
8,263,439 B2 9/2012 Marimuthu et al.
8,421,232 B2 4/2013 Ikeda et al.
8,535,553 B2 9/2013 Kong et al.
8,623,753 B1 1/2014 Yoshida et al.
8,643,185 B2 2/2014 Kajiwara et al.
8,710,649 B1 4/2014 Huemoeller et al.
8,927,334 B2 1/2015 Daubenspeck et al.
9,070,677 B2 6/2015 Park
9,105,613 B1 8/2015 Chen et al.
9,144,183 B2 9/2015 Chen et al.
9,202,742 B1 12/2015 Kim et al.
9,305,854 B2 4/2016 Shim et al.
9,337,073 B2 5/2016 Liu et al.
9,406,533 B2 8/2016 Chi et al.
9,576,922 B2 * 2/2017 Brunschwiler ...... B23K 1/0016
9,698,075 B2 7/2017 Venugopal et al.
9,780,071 B2 10/2017 Lee et al.
9,859,200 B2 1/2018 Park et al.
9,916,989 B2 3/2018 Yoon et al.
10,287,471 B2 5/2019 Zhang et al.
10,322,472 B2 6/2019 Hattori et al.
10,340,154 B2 * 7/2019 Kamikoriyama ....... H01L 24/29
10,421,123 B2 9/2019 Jeong et al.
10,510,733 B2 12/2019 Kumar et al.
10,566,104 B2 2/2020 Lee et al.
10,600,743 B2 3/2020 Lee et al.
10,784,181 B2 * 9/2020 Fu ...................... H01L 21/4871
10,854,549 B2 12/2020 Nakano
10,867,936 B2 12/2020 Wang et al.
10,872,879 B2 12/2020 Kim et al.
11,437,308 B2 9/2022 Rho et al.
11,652,060 B2 5/2023 Gomes et al.
11,810,844 B2 11/2023 Mok
12,388,029 B2 8/2025 Yim et al.
2002/0104669 A1 8/2002 Underwood et al.
2006/0007661 A1 1/2006 Iketaki
2008/0038871 A1 2/2008 Chiu et al.
2009/0096100 A1 * 4/2009 Kajiwara ................ H01L 24/29 252/512
2009/0152715 A1 6/2009 Shim et al.
2010/0109688 A1 5/2010 Eldridge et al.
2010/0129648 A1 5/2010 Xu et al.
2011/0006425 A1 1/2011 Wada et al.
2012/0018897 A1 1/2012 Park et al.
2012/0132930 A1 5/2012 Young et al.
2013/0056703 A1 3/2013 Elian et al.
2013/0063898 A1 3/2013 Schuett et al.
2013/0075923 A1 3/2013 Park et al.
2013/0082298 A1 4/2013 Golle et al.
2013/0082364 A1 4/2013 Wang et al.
2013/0134361 A1 5/2013 Lee et al.
2014/0024211 A1 1/2014 Ott et al.
2014/0103527 A1 4/2014 Mariumuthu et al.
2015/0179602 A1 6/2015 Camacho et al.
2016/0039662 A1 2/2016 Lin et al.
2016/0137507 A1 5/2016 You et al.
2016/0286698 A1 9/2016 Chang et al.
2016/0300777 A1 10/2016 Hong et al.
2017/0033086 A1 2/2017 Homma et al.
2017/0130034 A1 5/2017 Hwang et al.
2017/0167716 A1 6/2017 Ezaki et al.
2018/0323170 A1 11/2018 Kim et al.
2018/0346679 A1 12/2018 Shishkin et al.
2019/0139902 A1 5/2019 Lee et al.
2019/0181082 A1 6/2019 Chen et al.
2019/0206839 A1 7/2019 Balakrishnan et al.
2019/0259685 A1 * 8/2019 Hussain ............ H01L 23/49575
2019/0348344 A1 11/2019 Lu et al.
2019/0382627 A1 12/2019 Hu et al.
2019/0394898 A1 12/2019 Manninen et al.
2020/0002176 A1 * 1/2020 Gorton .................... C01B 32/19
2020/0075502 A1 3/2020 Kim et al.
2020/0161252 A1 5/2020 Yang et al.
2020/0227338 A1 7/2020 Gong
2020/0388552 A1 12/2020 Chou et al.
2021/0005512 A1 1/2021 Liu et al.
2021/0028122 A1 1/2021 Son et al.
2021/0151357 A1 5/2021 Cook et al.
2021/0257346 A1 8/2021 Baloglu et al.
2022/0002157 A1 1/2022 Corrigan et al.
2022/0066703 A1 3/2022 Hayes
2022/0352398 A1 11/2022 Munshi et al.
2022/0359418 A1 11/2022 Jung et al.
2023/0320106 A1 10/2023 Mun
2023/0323067 A1 10/2023 Yoshida et al.
2024/0096736 A1 * 3/2024 Shin .................... H01L 21/4882
2024/0128200 A1 4/2024 Shin et al.
2024/0153783 A1 5/2024 Lee et al.

FOREIGN PATENT DOCUMENTS

CN 106158790 A 11/2016
CN 110071074 A 7/2019
KR 101465616 B1 11/2014
KR 20150142090 A 12/2015
KR 10-1895114 B1 8/2018
KR 10-2395247 B1 5/2022
TW 202134169 A 9/2021
WO 2022113729 A1 6/2022

OTHER PUBLICATIONS

Graphmatech, “Graphmatech’s Graphene Technology Unlocks the Potential of Copper Additive Manufacturing” Website: https://graphmatech.com/graphmatechs-graphene-technology-unlocks-the-potential-of-copper-additive-manufacturing/, Feb. 9, 2021, Uppsala, Sweden.

* cited by examiner

SEMICONDUCTOR DEVICE AND METHOD OF DIE ATTACH WITH ADHESIVE LAYER CONTAINING GRAPHENE-COATED CORE

FIELD OF THE INVENTION

The present invention relates in general to semiconductor devices and, more particularly, to a semiconductor device and method of die attach with an adhesive layer containing graphene core shells embedded within a matrix.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, power conversion, photo-electric, and creating visual images for television displays. Semiconductor devices are found in the fields of communications, networks, computers, entertainment, and consumer products. Semiconductor devices are also found in military applications, aviation, automotive, industrial controllers, and office equipment.

Semiconductor devices, particularly in high power applications, often contain one or more semiconductor die or integrated passive devices (IPDs) to perform necessary electrical functions. The semiconductor die may contain power devices, such as a power transistor, capable of conducting large currents at high voltages in high stress environments. One or more semiconductor die and/or IPDs can be mounted to a leadframe or other substrate for structural support and electrical interconnect. An encapsulant is deposited over the semiconductor die, IPDs, and leadframe to form a semiconductor package, such as quad flat no-lead (QFN).

The semiconductor die and/or IPD must be bonded to the leadframe with sufficient strength to maintain physical integrity of the package over normal operating conditions, e.g., large current, high voltage, high frequency, and high stress environments, as found in power applications. Power applications can be robots, solar cells, Internet of Things (IoT), aerosols, and automotive, including electric vehicles. The semiconductor die may perform voltage conversion and wavenumber change. High stress involves high temperature, vibration, and physical shock. Given the extreme operating environment, the bonding material, e.g., Ag epoxy, between the semiconductor die and leadframe must have high reliability for the thermal and physical conditions of the semiconductor device.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements having a similar function are assigned the same reference number in the figures. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
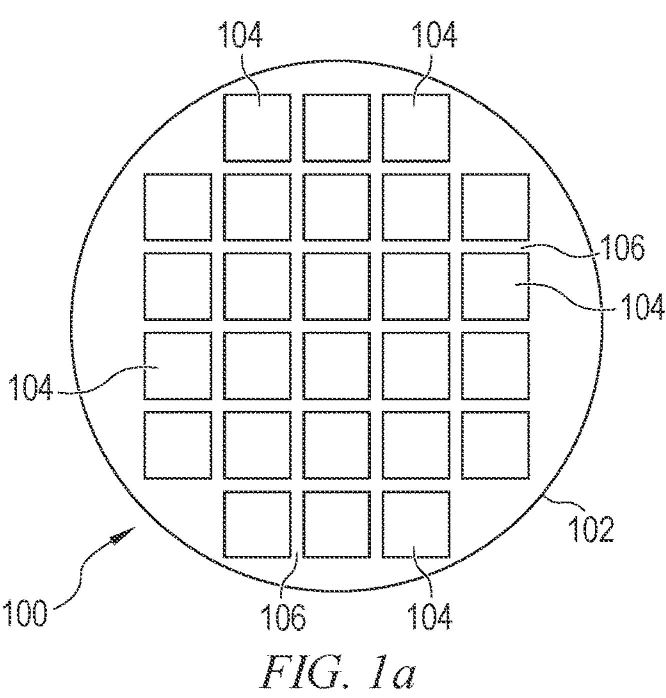
FIGS. 1*a*-1*c* illustrate a semiconductor wafer with a plurality of semiconductor die separated by a saw street.

FIG. 1*a* shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm). Alternatively, wafer 100 can be a mold surface, organic or inorganic substrate, or target substrate suitable for graphene transfer.

Figure 1B:
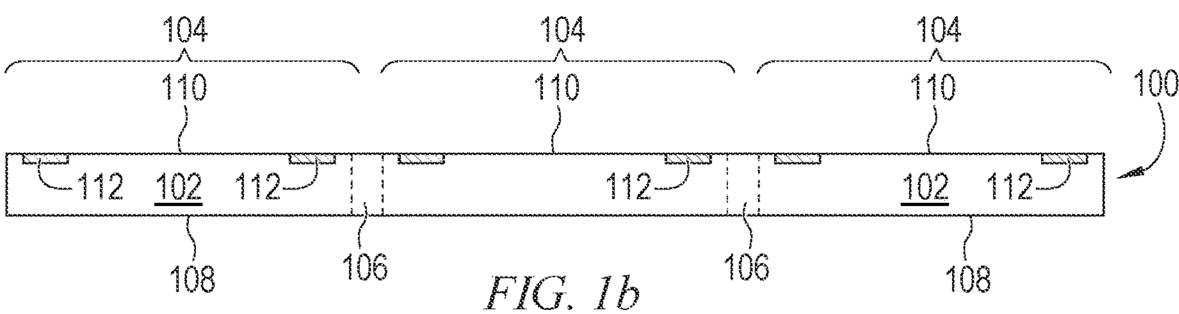

FIG. 1*b* shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, power devices, or other signal processing circuit. Semiconductor die 104 may also contain IPDs, such as inductors, capacitors, and resistors, for RF signal processing.

An electrically conductive layer 112 is formed over active surface 110 using physical vapor deposition (PVD), chemical vapor deposition (CVD), electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Figure 1C:
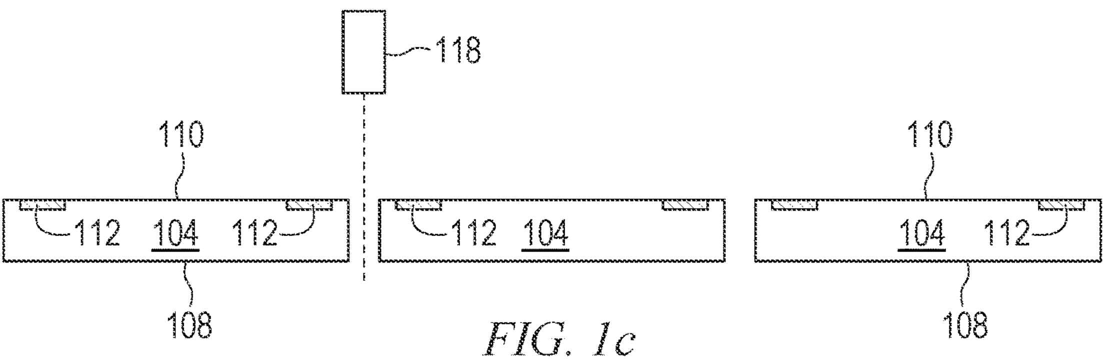

In FIG. 1*c*, semiconductor wafer 100 is singulated through saw street 106 using a saw blade or laser cutting tool 118 into individual semiconductor die 104. The individual semiconductor die 104 can be inspected and electrically tested for identification of known good die or known good unit (KGD/KGU) post singulation.

Figures 2A, 2B, 2C:
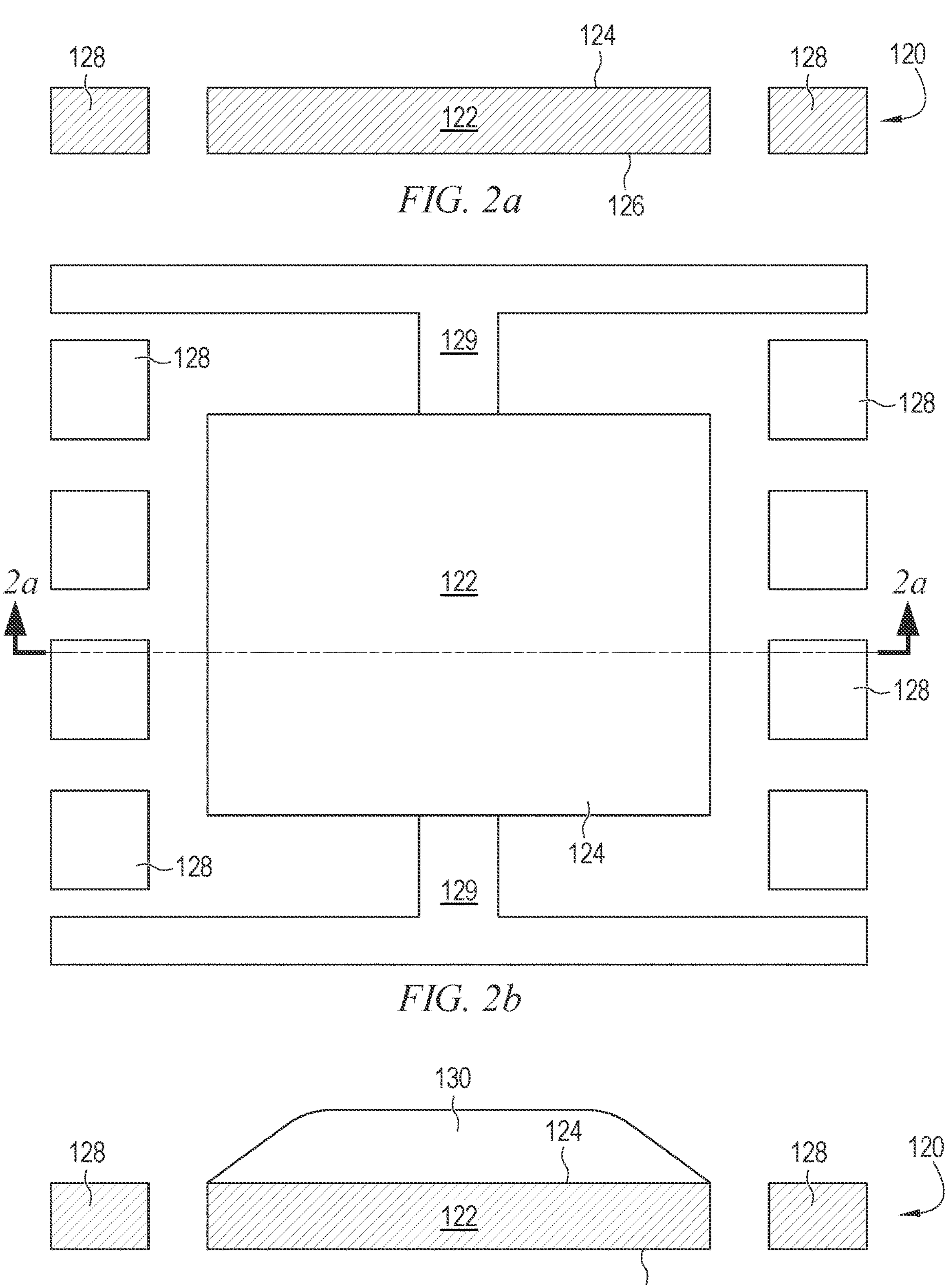
FIGS. 2*a*-2*g* illustrate a process of forming a semiconductor package.

FIGS. 2*a*-2*g* illustrate a process of using graphene core shells within an adhesive layer for die attach in a semiconductor package. FIG. 2*a* shows a cross-sectional view of substrate 120. In one embodiment, substrate 120 is a leadframe with flag or die mounting site 122 having a top surface 124 and bottom surface 126 opposite the top surface. Pads 128 are located around flag 122. The leadframe embodiment of substrate 120 is part of a quad flat no-lead (QFN) type semiconductor package, useful in power applications, such as robots, solar cells, IoT, aerosols, and automotive, including electric vehicles. FIG. 2*b* is a top view of substrate 120 showing flag 122 and pads 128 interconnected by support bar 129 constituting the leadframe. Alternatively, substrate 120 can be a semiconductor wafer or panel substrate with a base substrate material, such as silicon, germanium, aluminum phosphide, aluminum arsenide, gallium arsenide, gallium nitride, indium phosphide, or silicon carbide for structural support.

In FIG. 2*c*, graphene-filler adhesive layer 130 is deposited on surface 124 of flag 122 of substrate 120. Graphene-filler adhesive layer 130 is discussed infra.

Figure 2D:
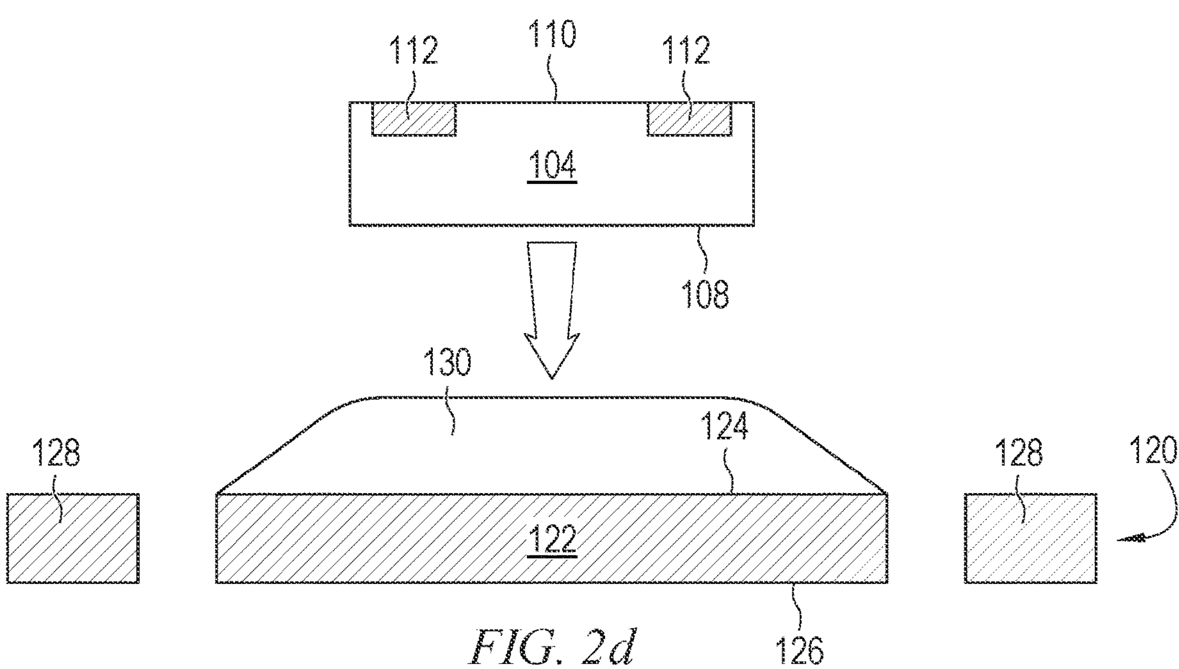
Figure 2E:
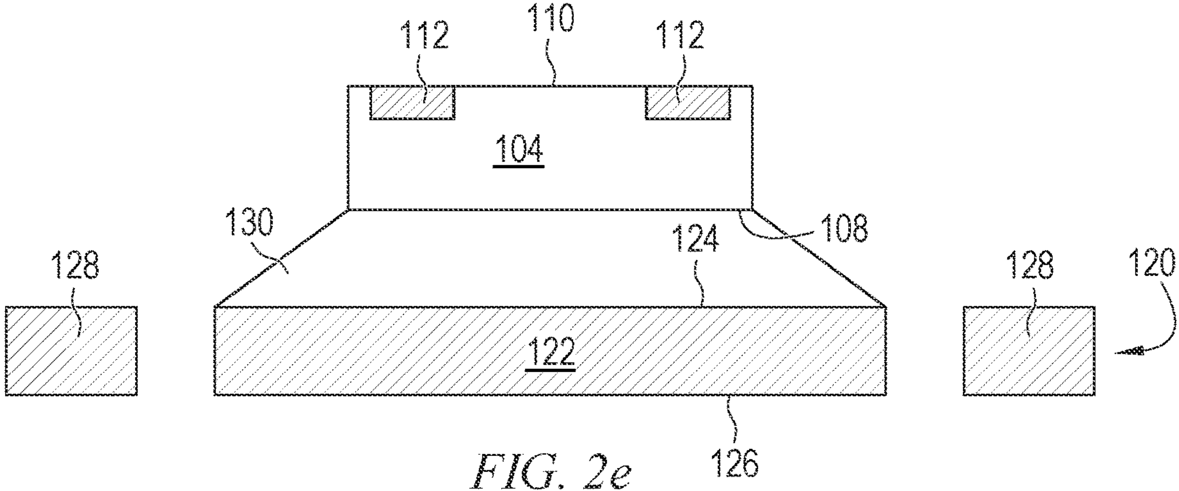

In FIG. 2*d*, semiconductor die 104 from FIG. 1*c* is disposed over adhesive layer 130 using a pick and place operation. Leading with back surface 108, semiconductor die 104 is brought into contact with graphene-filler adhesive layer 130. Adhesive layer 130 is cured to secure semiconductor die 104 to flag 122, as shown in FIG. 2*e*.

Figure 2F:
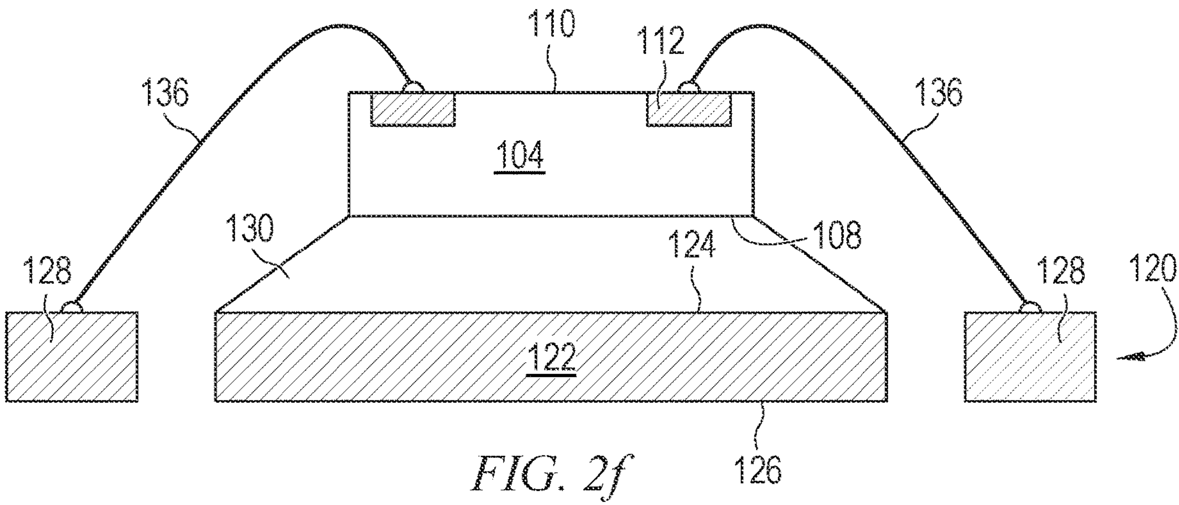

In FIG. 2*f*, bond wires 136 are placed between conductive layer 112 on semiconductor die 104 and pads 128 of leadframe substrate 120. Each end of bond wires 136 is reflowed to make mechanical and electrical connection between conductive layer 112 and pads 128.

Figure 2G:
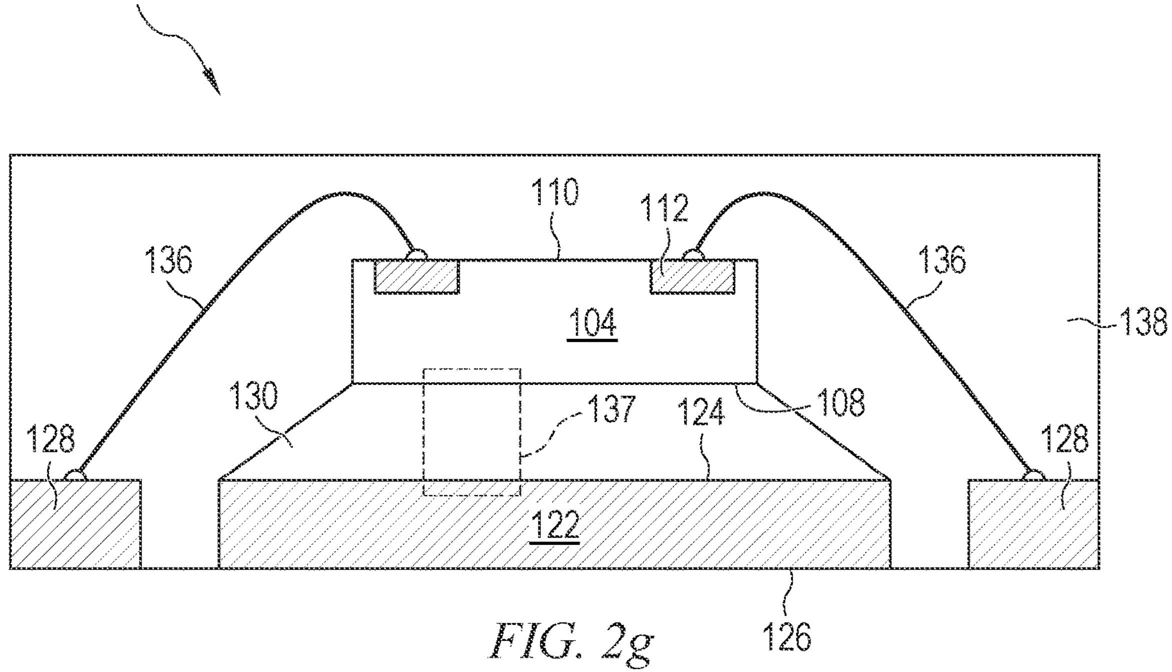

In FIG. 2*g*, encapsulant or molding compound 138 is deposited over and around semiconductor die 104 and substrate 120 using a paste printing, compressive molding, transfer molding, liquid encapsulant molding, vacuum lamination, spin coating, or other suitable applicator. Encapsulant 138 can be liquid or granular polymer composite material, such as epoxy resin with filler, epoxy acrylate with filler, or polymer with proper filler. Encapsulant 138 is non-conductive, provides structural support, and environmentally protects the semiconductor device from external elements and contaminants.

Support segments 129 are severed leaving pads 128 electrically isolated from each other. The combination of substrate 120, semiconductor die 104, and encapsulant 138 constitutes semiconductor package 139.

Figure 3:
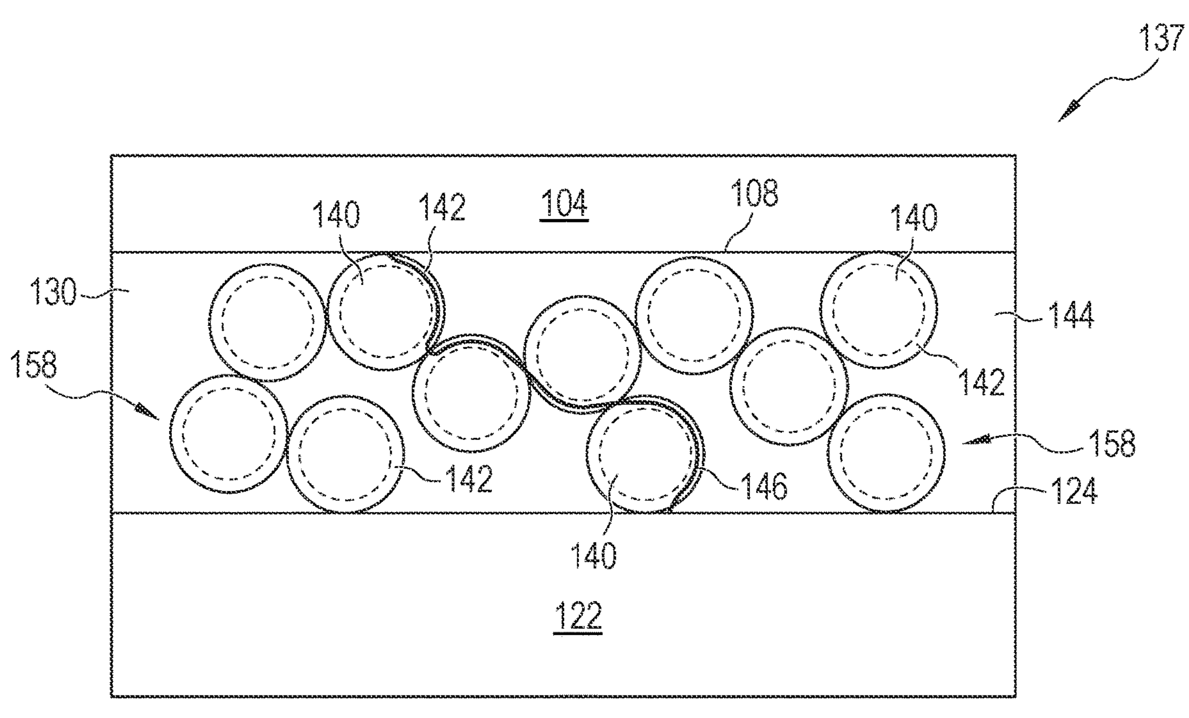
FIG. 3 illustrates an adhesive layer containing graphene core shells within a matrix.

FIG. 3 shows further detail of region or box 137 from FIG. 2*g*. In one embodiment, adhesive layer 130 includes a plurality of cores 140 with graphene coating 142 embedded within matrix 144, as shown in FIG. 3. Matrix 144 can be a thermoset material, such as epoxy resin or adhesive with binder and filler containing silicon, alumina, Al, aluminum zinc oxide, or other material having good adhesive and thermal properties. Matrix 144 can be thermal grease such as silicon or polymer type such as polymethyl methacrylate (PMMA) or polyethylene terephthalate (PET). Core 140 can be Cu, Ni, phase change material (PCM), or other suitable metal or similar material. Cores 140 are arranged within matrix 144 so that most if not all graphene coatings 142 covering the core contact at least one adjacent graphene coating to form a continuous and connecting path 146 of graphene coatings between top surface 124 of leadframe flag 122 and surface 108 of semiconductor die 104. A first graphene coating 142 contacts a second adjacent graphene coating, which in turn contacts a third adjacent graphene coating, and so on, to form continuous and connecting path 146. Cores 140 have sufficient density that most if not all the graphene coatings around the cores contact at least one graphene coating around an adjacent core, and typically contact graphene coating of multiple adjacent cores. In one embodiment, continuous and connecting path 146 is a thermal path to dissipate heat away from semiconductor package 139.

Figure 4:
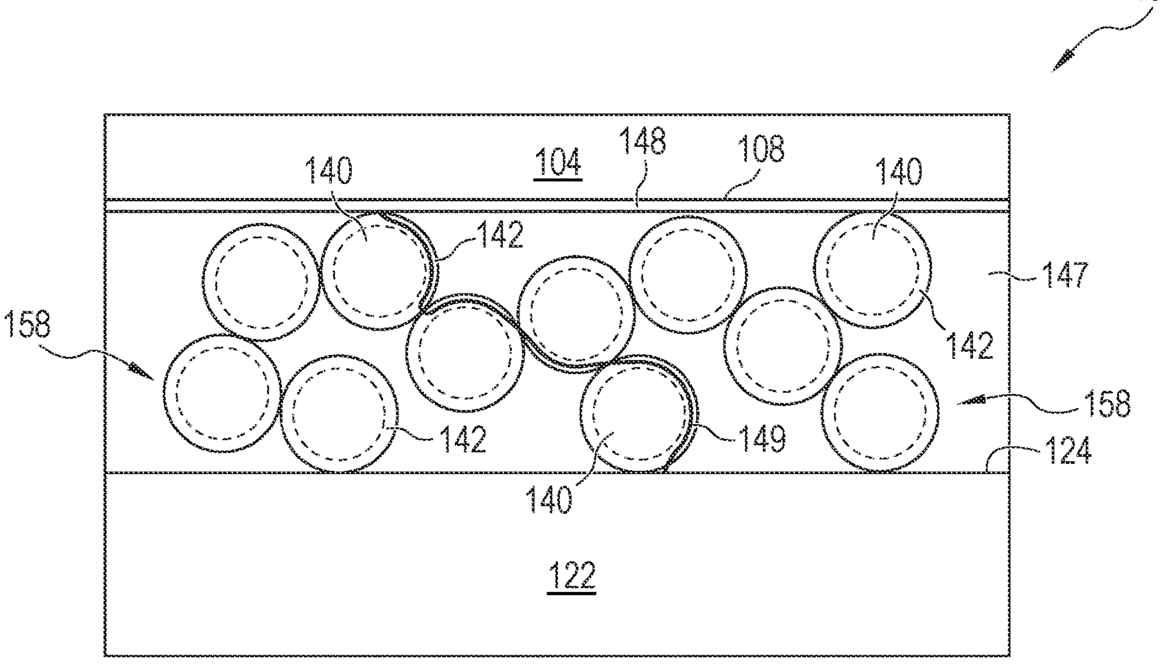
FIG. 4 illustrates another embodiment of the adhesive layer containing graphene core shells within a matrix.

In another embodiment, FIG. 4 shows further detail of region or box 137 from FIG. 2*g*. In this case, matrix 147 is solder containing one or more elements of Sn, lead (Pb), or indium (In). Again, core 140 can be Cu, Ni, PCM, or other suitable metal or similar material. Each core 140, as embedded in matrix 144 or 147, is surrounded or covered by graphene coating or shell 142. In one embodiment, a graphene paste or ink is formed around a Cu core as graphene core shell 158. An adhesive layer 148, such as Cu/SuS, titanium (Ti), or Ag, is formed over matrix 147 to contact surface 108 of semiconductor die 104.

Cores 140 are arranged within matrix 147 so that most if not all graphene coatings 142 covering the core contact at least one adjacent graphene coating to form a continuous and connecting path 149 of graphene coatings between top surface 124 of leadframe flag 122 and adhesive layer 148 at surface 108 of semiconductor die 104. Graphene coating 142 of each core 140 contacts the graphene coating of an adjacent core. A first graphene coating 142 contacts a second adjacent graphene coating, which in turn contacts a third adjacent graphene coating, and so on, to form continuous and connecting path 149. Cores 140 have sufficient density that most if not all the graphene coatings around the cores contact at least one graphene coating around an adjacent core, and typically contact graphene coating of multiple adjacent cores.

Figures 5A, 5B, 5C:
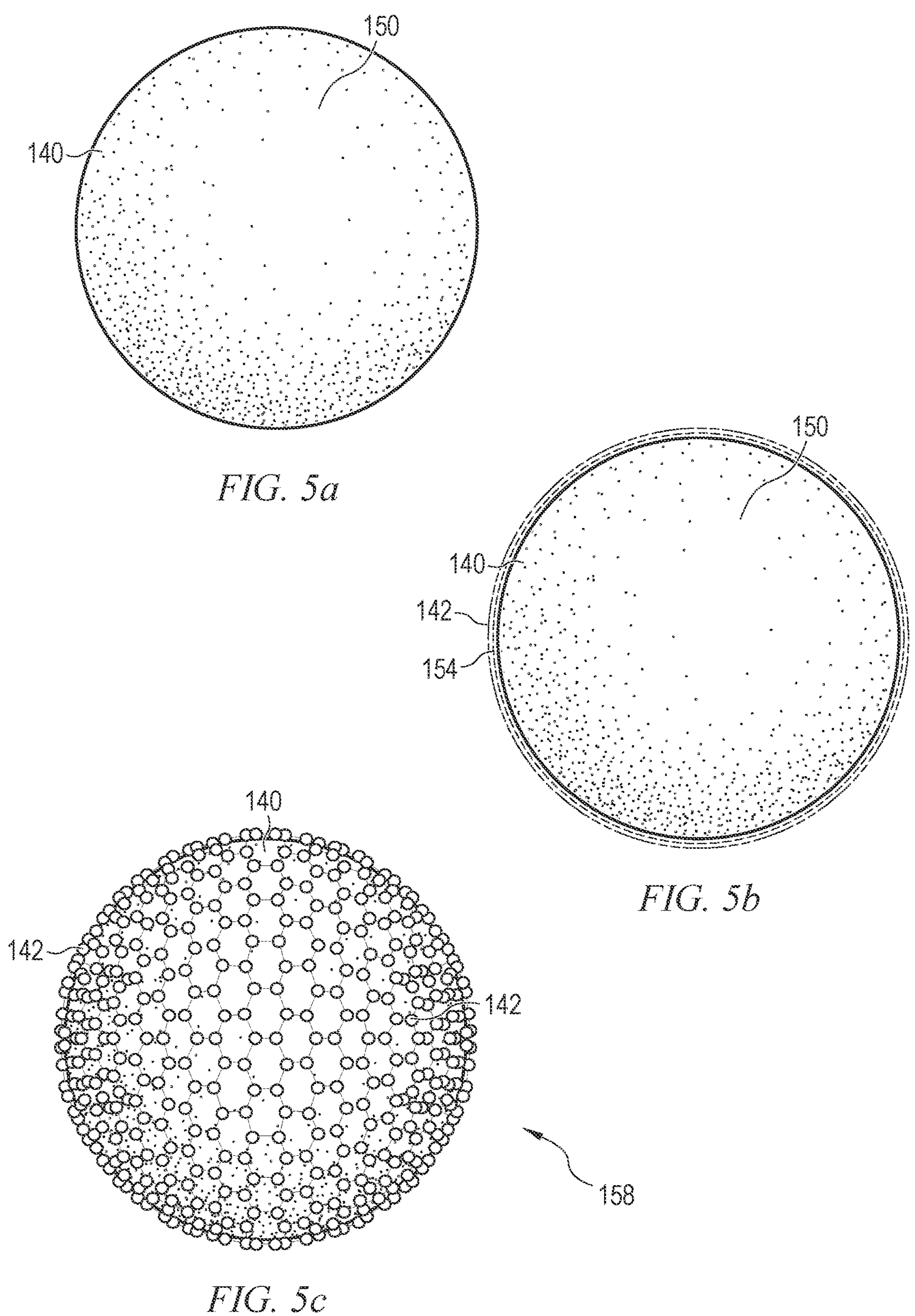
FIGS. 5*a*-5*c* illustrate a process of forming a graphene core shell.

FIGS. 5*a*-5*c* illustrate further detail of core 140, graphene coating 142, and graphene core shell 158. In one embodiment, core 140 is Cu, Ni, PCM, or other suitable metal or similar material. FIG. 5*b* illustrates graphene coating 142 formed over and around surface 150 of core 140. FIG. 5*c* illustrates further detail of graphene coating 142 formed as a mesh network around surface 150 of core 140, collectively graphene core shell 158. Graphene 142 is an allotrope of carbon with one or more layers of carbon atoms each arranged in a two-dimensional (2D) honeycomb lattice. Graphene coating 142 can be formed by CVD. Core 140 is placed in a chamber heated to 900-1080° C. A gas mixture of $CH_4/H_2/Ar$ is introduced into the chamber to initiate a CVD reaction. The carbon source decomposes in the high-temperature reaction chamber as the CVD reaction separates the carbon atoms from the hydrogen atoms, leaving graphene coating 142 on surface 150 of core 140. The release of carbon atoms over core 140 forms a continuous sheet of graphene coating 142. Additional information related to forming graphene coating by CVD is disclosed in U.S. Pat. No. 8,535,553, and hereby incorporated by reference.

Core 140 is PCM capable of phase change from solid to liquid phase or from liquid phase to solid phase within the operating temperature range of the semiconductor chip, e.g., 20-200° C. A first coating 154 is formed around PCM core 140, as shown in FIG. 5*b* and discussed in published Korean application KR101465616B1. The first coating 154 can be a polymer intermediate layer. A second coating 142 is formed over the first coating 154. Matrix 144, 147 with graphene covered cores is further disclosed in U.S. patent Ser. No. 10/421,123, and all are incorporated herein by reference.

The properties of graphene are summarized in Table 1, as follows:

TABLE 1

Properties of graphene

| Parameter | |
|---|---|
| Electronic mobility | $2 \times 10^5$ $cm^2 V^{-1} s^{-1}$ |
| Current density | $10^9$ $A\ cm^{-1}$ |
| Velocity of fermion (electron) | $10^6$ $m\ s^{-1}$ |
| Thermal conductivity | 4000-5000 $W\ m^{-1} K^{-1}$ |
| Tensile strength | 1.5 Tpa |
| Breaking strength | 42 $N\ m^{-1}$ |
| Transparency | 97.7% |
| Elastic limit | 20% |
| Surface area | 2360 $m^2 g^{-1}$ |

Graphene 142 has ten times the electrical conductivity of Cu. Graphene 142 enables epoxy to exhibit electrical conductivity similar to Ag, while reducing or eliminating oxidation. Core shell 158 with Cu and graphene epoxy is low cost, as compared to sputtering. Graphene 142 has a low moisture permeability and a high thermal conductivity of 4000-5000 $W\ m^{-1} K^{-1}$, 10 times higher than Cu at room temperature. Since carbon also has a good solderability and wettability of solder paste, adhesive layer 130 can be readily formed. Graphene 142 exhibits a high degree of flexibility and remains stable against warpage. Adhesive layer 130 with graphene Cu shells 158 improves die attach properties and electrical conductivity, while lowering manufacturing cost.

Figure 6:
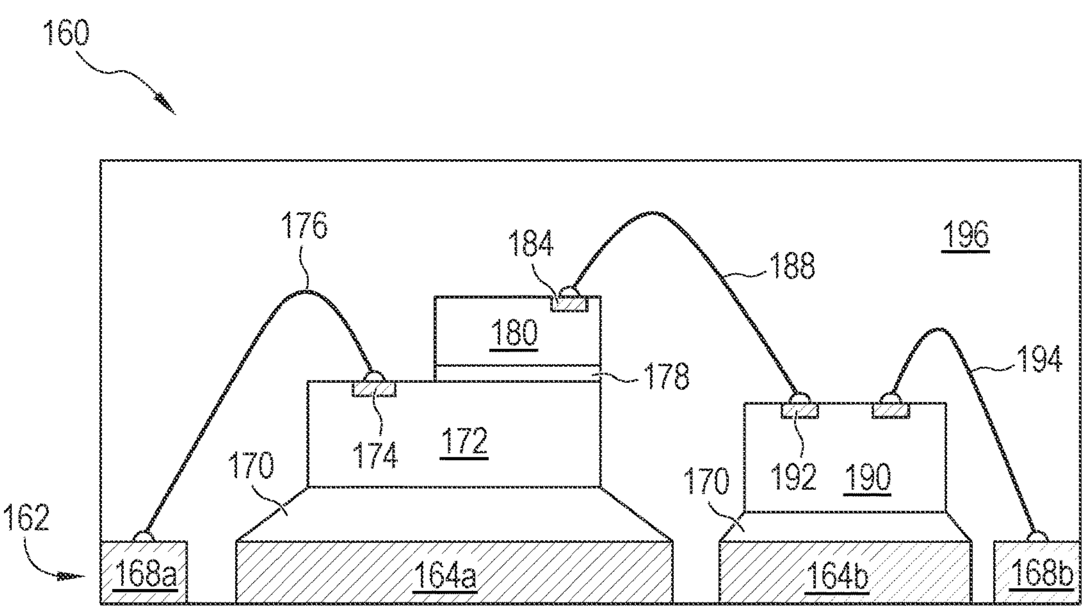
FIG. 6 illustrates another semiconductor package using the adhesive layer containing graphene core shells within a matrix.

In another embodiment, semiconductor package 160 uses leadframe substrate 162 with flags 164*a* and 164 and pads 168*a* and 168*b*, similar to leadframe substrate 120 but with multiple flags for mounting multiple semiconductor die, as shown in FIG. 6. Adhesive layer 170 is deposited over flags 164*a* and 164*b*, similar to FIG. 2*c*. Adhesive layer 170 is similar to adhesive layer 130, containing a matrix and core shells, as described in FIGS. 3-5. Semiconductor die 172 is affixed to adhesive layer 170 over flag 164*a*, similar to FIGS. 2*d*-2*e*. Conductive layer 174, connected to the active surface of semiconductor die 170, is coupled to pad 168*a* with wire bond 176. Semiconductor die 180 is affixed to adhesive layer 178 over the active surface of semiconductor die 172, similar to FIGS. 2*d*-2*e*. Adhesive layer 178 can be similar to adhesive layer 130, containing a matrix and core shells, as described in FIGS. 3-5. Adhesive layer 178 can be other types of adhesive material, such as epoxy resin. Each end of bond wires 176 is reflowed to make mechanical and electrical connection between conductive layer 174 and pads 168*a*. Semiconductor die 172, 180, and 190 can be made similar to the wafer from FIGS. 1*a*-1*c*, although with a different form and function.

Semiconductor die 190 is affixed to adhesive layer 170 over flag 164*b*, similar to FIGS. 2*d*-2*e*. Conductive layer 192, connected to the active surface of semiconductor die 190, is coupled to pad 168*b* with wire bond 194. Conductive layer 184, connected to the active surface of semiconductor die 180, is coupled to conductive layer 192 on semiconductor die 190 with wire bond 188. Each end of bond wires 188 and 194 is reflowed to make mechanical and electrical connection between semiconductor die 180 and 190 and leadframe substrate 162. Adhesive layer 170 with matrix and graphene core shells provides improved die attach properties for semiconductor die 172 and 190, as described for adhesive layer 130 in FIGS. 3-5.

An encapsulant or molding compound 196 is deposited over and around semiconductor die 170, 180, and 190 and leadframe substrate 162 using a paste printing, compressive molding, transfer molding, liquid encapsulant molding, vacuum lamination, spin coating, or other suitable applicator. Encapsulant 196 can be liquid or granular polymer composite material, such as epoxy resin with filler, epoxy acrylate with filler, or polymer with proper filler. Encapsulant 196 is non-conductive, provides structural support, and environmentally protects the semiconductor device from external elements and contaminants.

Figure 7:
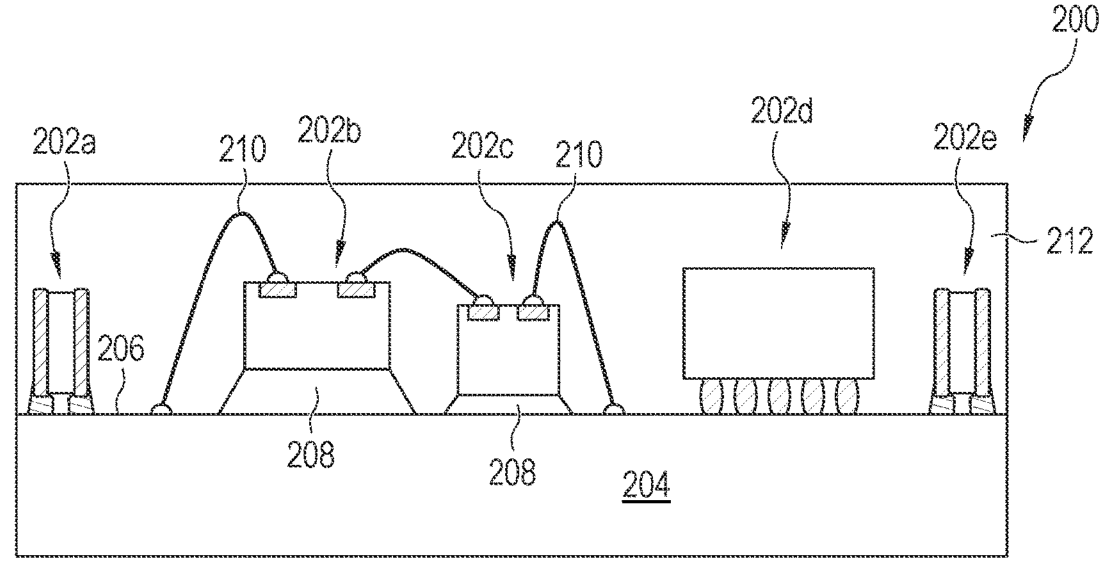
FIG. 7 illustrates yet another semiconductor package using the adhesive layer containing graphene core shells within a matrix.

In another embodiment, semiconductor package 200 uses substrate 204 with a base substrate material, such as silicon, germanium, aluminum phosphide, aluminum arsenide, gallium arsenide, gallium nitride, indium phosphide, silicon carbide for structural support, as shown in FIG. 7. Adhesive layer 208 is deposited over surface 206 of substrate 204, similar to FIG. 2*c*. Adhesive layer 208 is similar die attach features as adhesive layer 130, containing a matrix and core shells, as described in FIGS. 3-5.

Electrical components 202*a*-202*e* are disposed on surface 206 of substrate 204. In particular, electrical components 202*b* and 202*c* are disposed on surface 206 using adhesive layer 208, similar to FIGS. 2*d*-2*e*. Electrical components 202*b*-202*d* can be similar to semiconductor die 104 from FIG. 1*c*, although with a different form and function. Electrical component 202*a* and 202*e* can be discrete electrical devices, or IPDs, such as a diode, transistor, resistor, capacitor, and inductor. Alternatively, electrical components 202*a*-202*e* can include other semiconductor die, semiconductor packages, surface mount devices, RF components, discrete electrical devices, or integrated passive devices (IPD). Adhesive layer 208 with matrix and graphene core shells provides improved die attach properties for electrical components 202*b* and 202*c*, as described for adhesive layer 130 in FIGS. 3-5.

Bond wires 210 electrically connect electrical components 202*b* and 202*c* to substrate 204. An encapsulant or molding compound 212 is deposited over and around electrical components 202*a*-202*e* and substrate 204 using a paste printing, compressive molding, transfer molding, liquid encapsulant molding, vacuum lamination, spin coating, or other suitable applicator. Encapsulant 212 can be liquid or granular polymer composite material, such as epoxy resin with filler, epoxy acrylate with filler, or polymer with proper filler. Encapsulant 212 is non-conductive, provides structural support, and environmentally protects the semiconductor device from external elements and contaminants.

Figure 8A:
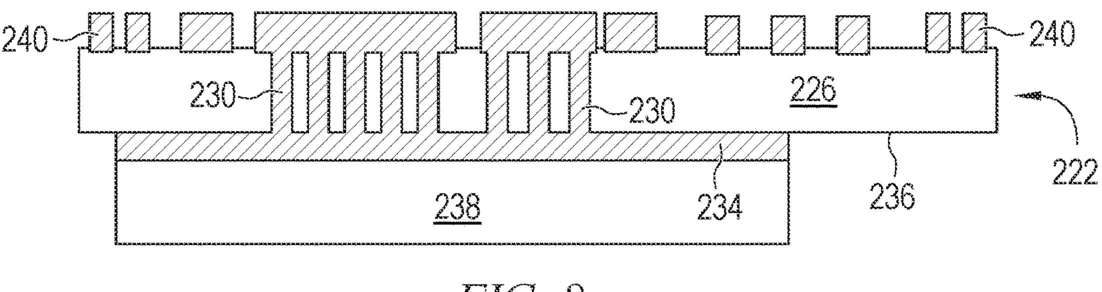
FIGS. 8*a*-8*c* illustrate yet another semiconductor package using the adhesive layer containing graphene core shells within a matrix.

In another embodiment, substrate 222 contains base substrate material 226, such as silicon, germanium, aluminum phosphide, aluminum arsenide, gallium arsenide, gallium nitride, indium phosphide, or silicon carbide for structural support, as shown in FIG. 8*a*. In one embodiment, substrate 222 is a PCB. Conductive vias 230 are formed through base substrate material 226. Conductive layer 234 is formed over surface 236 of substrate 222 and electrically and thermally connected to conductive vias 230. Heat sink 238 is formed over conductive layer 234 to provide heat dissipation from the package. Heat sink 238 can be one or more layers of Al, Cu, Sn, Ni, Au, Ag, or other suitable thermally conductive material to dissipate heat generated by electrical components 244*a*-244*e*. Conductive layer 240 is formed over surface 242 of substrate 222 and electrically and thermally connected to conductive vias 230.

Figure 8B:
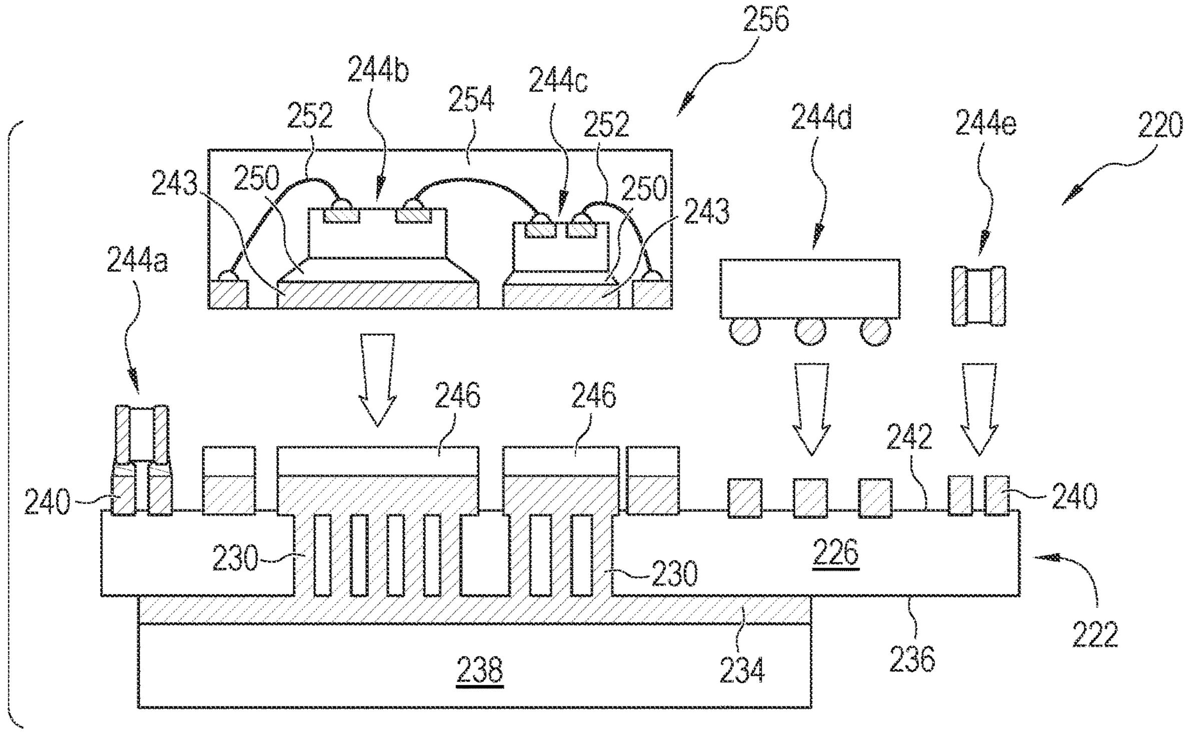

In FIG. 8*b*, leadframe module 256 is formed with leadframe substrate 243 including flags and pads. Electrical components 244*b* and 244*c* are affixed to the flags of leadframe substrate 243 with adhesive layer 250. Adhesive layer 250 is made similar to adhesive layer 130, containing a matrix and core shells, as described in FIGS. 3-5. Bond wires 252 electrically connect electrical components 244*b* and 244*c* to the pads of leadframe substrate 243. Encapsulant 254 is deposited over electrical components 244*b* and 244*c*, bond wires 252, and leadframe substrate 243, providing leadframe module 256, similar to FIGS. 2*a*-2*e*.

Figure 8C:
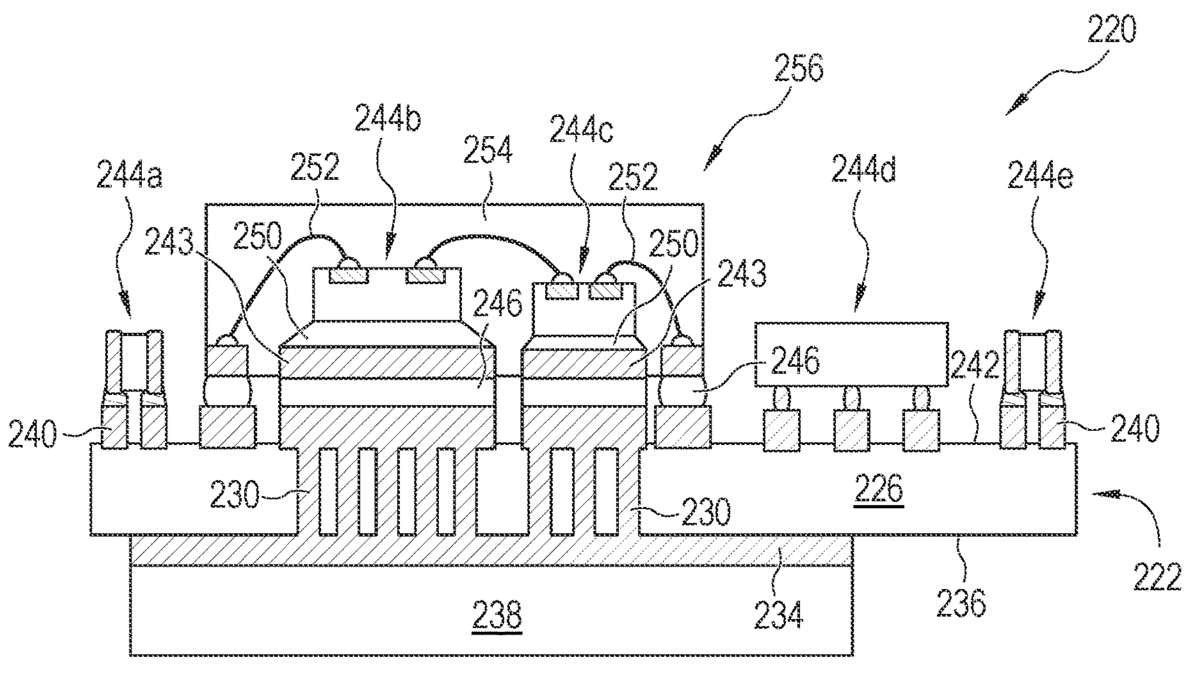

An adhesive layer 246 is deposited over conductive layer 240. Adhesive layer 246 is made similar to adhesive layer 130, containing a matrix and core shells, as described in FIGS. 3-5. Electrical components 244*a*-244*e* are positioned over surface 242 of substrate 222 using a pick and place operation, with electrical components 244*b* and 244*c* being part of leadframe module 256. Electrical components 244*a*, 244*d*, and 244*e* are then reflowed to affix to conductive layer 240 on substrate 222. Electrical components 244*a*, 244*d*, and 244*e* are individual semiconductor die or discrete devices. Electrical components 244*b* and 244*c*, being part of leadframe module 256, are affixed to conductive layer 240 with adhesive layer 246. Electrical components 244*b*, 244*c*, and 244*d* can be similar to semiconductor die 104 from FIG. 1*c*, although with a different form and function. Electrical component 244*a* and 244*e* can be discrete electrical devices, or IPDs, such as a diode, transistor, resistor, capacitor, and inductor. Alternatively, electrical components 244*a*-244*e* can include other semiconductor die, semiconductor packages, surface mount devices, RF components, discrete electrical devices, or IPD. FIG. 8*c* shows electrical components 244*a*-244*e* (with electrical components 244*b* and 244*c* being part of leadframe module 256) mounted to substrate 222 as semiconductor package 220.

Adhesive layers 246 and 250 with matrix and graphene core shells provide improved die attach properties for electrical components 244*b* and 244*c* and substrate 243, as described for adhesive layer 130 in FIGS. 3-5. In addition, adhesive layers 246 and 250 have good electrical conductivity and high thermal conductivity due to the graphene Cu core shells. Electrical components 244*b* and 244*c* can make electrical connection through bond wires 252, leadframe pads, adhesive layer 246, conductive layer 240, and conductive vias 230. Heat generated from leadframe module 256 is conducted through adhesive layers 246 and 250, conductive layer 234, and dissipated by heat sink 238.

An adhesive layer like 130 with graphene core shells such as 158 distributed in matrix 144 are useful for die attachment. Same is true for adhesive layers 170, 208, 246, and 250. The graphene core adhesive layer provides exceptional heat dissipation, shock absorption, and vibration dampening. The graphene core adhesive layer can be used in power applications, such as automotive, to support physical stress, vibration, temperature variation, high voltage, high power, and high frequency operation.

Figure 9:
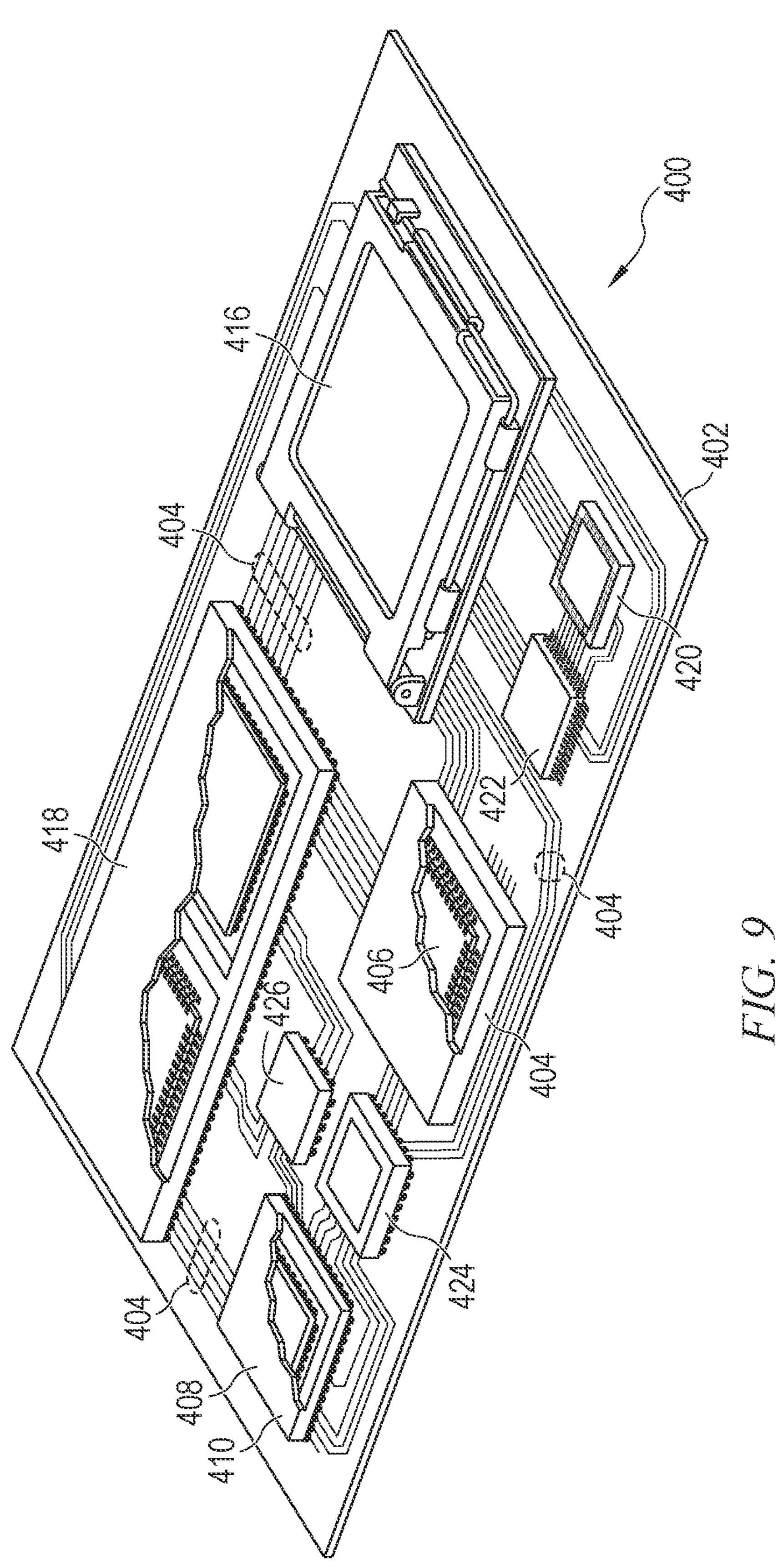
FIG. 9 illustrates a printed circuit board (PCB) with different types of packages disposed on a surface of the PCB.

FIG. 9 illustrates electrical device 400 having a chip carrier substrate or PCB 402 with a plurality of semiconductor packages disposed on a surface of PCB 402, including packages 139, 160, 200, and 220. Electrical device 400 can have one type of semiconductor package, or multiple types of semiconductor packages, depending on the application.

Electrical device 400 can be a stand-alone system that uses the semiconductor packages to perform one or more electrical functions. Alternatively, electrical device 400 can be a subcomponent of a larger system. For example, electrical device 400 can be part of a tablet, cellular phone, digital camera, communication system, or other electrical device. Alternatively, electrical device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 9, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electrical components, can be connected to PCB 402. In some embodiments, electrical device 400 includes a single attached semiconductor package, while other embodiments call for multiple interconnected packages. By combining one or more semiconductor packages over a single substrate, manufacturers can incorporate pre-made components into electrical devices and systems. Because the semiconductor packages include sophisticated functionality, electrical devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:

a substrate;

an adhesive layer including a plurality of graphene core shells deposited over a surface of the substrate; and an electrical component affixed to the substrate with the adhesive layer, wherein the graphene core shells each are interconnected as one graphene core shell of the plurality of graphene core shells contacts another graphene core shell of the plurality of graphene core shells within the adhesive layer to form a continuous thermal conduction path between the surface of the substrate and electrical component.

2. The semiconductor device of claim 1, wherein the graphene core shell includes a copper core.

3. The semiconductor device of claim 2, wherein the graphene core shell further includes a graphene coating formed over the copper core.

4. The semiconductor device of claim 1, wherein the adhesive layer further includes a matrix to embed the graphene core shell.

5. The semiconductor device of claim 1, wherein the adhesive layer includes thermoset material or polymer or composite epoxy type matrix and the graphene core shell is embedded within the thermoset material or polymer or composite epoxy type matrix.

6. The semiconductor device of claim 1, further including:

a first graphene core shell of the plurality of graphene core shells; and a second graphene core shell of the plurality of graphene core shells, wherein the second graphene core shell contacts the first graphene core shell to form a portion of the continuous thermal conduction path.

7. A semiconductor device, comprising:

a substrate;

a graphene core adhesive layer deposited on a surface of the substrate; and an electrical component affixed to the substrate with the graphene core adhesive layer, wherein the graphene core adhesive layer includes a plurality of graphene core shells each interconnected as each graphene core shell of the plurality of graphene core shells contacts another graphene core shell of the plurality of graphene core shells within the graphene core adhesive layer to form a continuous conduction path between the surface of the substrate and electrical component.

8. The semiconductor device of claim 7, wherein the graphene core adhesive layer includes a copper core.

9. The semiconductor device of claim 8, wherein the graphene core adhesive layer further includes a graphene coating formed over the copper core.

10. The semiconductor device of claim 9, wherein the graphene core adhesive layer further includes a matrix to embed the graphene coated copper core.

11. The semiconductor device of claim 7, wherein the adhesive layer includes thermoset material or polymer or composite epoxy type matrix and the graphene core shell is embedded within the thermoset material or polymer or composite epoxy type matrix.

12. The semiconductor device of claim 7, further including a bond wire connected between the electrical component and substrate.

13. The semiconductor device of claim 7, further including:

a first graphene core shell of the plurality of graphene core shells; and a second graphene core shell of the plurality of graphene core shells, wherein the second graphene core shell contacts the first graphene core shell to form a portion of the continuous conduction path.

14. A method of making a semiconductor device, comprising:

providing a substrate;

depositing an adhesive layer including a plurality of graphene core shells over a surface of the substrate; and affixing an electrical component to the substrate with the adhesive layer, wherein the graphene core shells each are interconnected within the adhesive layer to form a continuous conduction path between the surface of the substrate and electrical component.

15. The method of claim 14, wherein the graphene core shell includes providing a copper core.

16. The method of claim 15, wherein the graphene core adhesive layer further includes forming a graphene coating over the copper core.

17. The method of claim 16, wherein the adhesive layer further includes embedding the graphene coated copper core in a matrix.

18. The method of claim 14, further including providing a bond wire connected between the electrical component and substrate.

19. The method of claim 14, further including:

providing a first graphene core shell of the plurality of graphene core shells; and providing a second graphene core shell of the plurality of graphene core shells, wherein the second graphene core shell contacts the first graphene core shell to form a portion of the continuous conduction path.

20. A method of making a semiconductor device, comprising:

providing a substrate;

depositing a graphene core adhesive layer over a surface of the substrate; and affixing an electrical component to the substrate with the graphene core adhesive layer, wherein the graphene core adhesive layer includes a plurality of graphene core shells each interconnected within the graphene core adhesive layer to form a continuous conduction path between the surface of the substrate and electrical component.

21. The method of claim 20, wherein the graphene core adhesive layer includes providing a copper core.

22. The method of claim 21, wherein the graphene core adhesive layer further includes forming a graphene coating over the copper core.

23. The method of claim 22, wherein the graphene core adhesive layer further includes embedding the graphene coated copper core in a matrix.

24. The method of claim 20, further including providing a bond wire connected between the electrical component and substrate.

25. The method of claim 20, further including:

providing a first graphene core shell of the plurality of graphene core shells; and providing a second graphene core shell of the plurality of graphene core shells, wherein the second graphene core shell contacts the first graphene core shell to form a portion of the continuous conduction path.

* * * * *